310-334
5/1/84 OR 4,446,396

United States Patent [19] [11] 4,446,396
Claus et al. [45] May 1, 1984

[54] ULTRASONIC TRANSDUCER WITH GAUSSIAN RADIAL PRESSURE DISTRIBUTION

[75] Inventors: Richard O. Claus, Christiansburg, Va.; Paul S. Zerwekh, Palm Bay, Fla.

[73] Assignee: The United States of America as represented by the Administrator of the National Aeronautics and Space Administration, Washington, D.C.

[21] Appl. No.: 414,107

[22] Filed: Sep. 2, 1982

[51] Int. Cl.³ .......... H01L 41/08
[52] U.S. Cl. .......... 310/334; 310/317; 310/366
[58] Field of Search .......... 310/334–337, 310/317, 366

[56] References Cited

U.S. PATENT DOCUMENTS

| | | | |
|---|---|---|---|
| 2,875,355 | 2/1959 | Petermann | 310/334 |
| 3,090,030 | 5/1963 | Schuck | 310/334 X |
| 4,129,799 | 12/1978 | Green | 310/366 X |
| 4,155,259 | 5/1979 | Engeler | 310/334 X |
| 4,211,948 | 7/1980 | Smith | 310/334 X |
| 4,398,116 | 8/1983 | Lewis | 310/334 |

*Primary Examiner*—Mark O. Budd
*Attorney, Agent, or Firm*—Howard J. Osborn; John R. Manning; William H. King

[57] ABSTRACT

A piezoelectric crystal with several concentric ring electrodes on one side of the crystal. A resistor network applies different amplitudes of an AC source to each of the several electrodes. A plot of the different amplitudes from the outermost electrode to the innermost electrode is the first half of a Gaussian function. Consequently, the output of the crystal from the side opposite the electrodes has a Gaussian profile.

7 Claims, 6 Drawing Figures

ULTRASONIC TRANSDUCER WITH GAUSSIAN RADIAL PRESSURE DISTRIBUTION

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

The invention relates generally to an ultrasonic transducer and more specifically concerns an ultrasonic transducer with a Gaussian radial pressure distribution.

In materials evaluation applications requiring the interrogation of the modified far field pattern of an ultrasonic transducer it is desirable to use the transducer which produces a beam with a Gaussian profile. A simplified theoretical analysis of several bulk ultrasonic phenomenon require the consideration of bounded ultrasonic beams having velocity distributions which are Gaussian as a function of radius. Additionally, since the beam profiles in the near field and far field regions are related by a Fourier transform operation, Gaussian profile beams are particularly useful in experimental situations in which a similarity between a near and far field pattern is desired.

A standard prior art surface contact transducer typically generates a field which is approximately uniform in the region near its contact surface (FIG. *1a*) and negligible elsewhere. The resulting far field pattern thus contains significant sidelobe maxima, as shown in FIG. *1b*, which may be difficult to distinguish from the central beam in experiments involving beam translation and attenuation. Several transducer designs employing single electrodes of various shapes have been designed to provide a field which when averaged around the radii is a Gaussian function of radius. These electrode designs, however, introduce a distribution that is a function of angular displacement on the face of the transducer and not purely a function of radius. In the Journal of the Acoustical Society of America, vol. 49, pp 1668–1669, a method is described for generating a velocity distribution which is Gaussian utilizing multiple linear electrodes. However, this Gaussian function is in one dimension only.

An object of this invention is to provide an ultrasonic transducer that produces an output having a Gaussian profile.

Another object of this invention is to provide an ultrasonic transducer that produces an output having a Gaussian profile as a function of radius.

A further object of this invention is to provide an ultrasonic transducer that produces an output in which all cross-sections of the output through the center of the output is a Gaussian function.

Still another object of this invention is to provide an ultrasonic transducer that produces an output having a Gaussian profile and in which a far field pattern of the output is similar to a near field pattern of the output.

A still further object of this invention is to provide an ultrasonic transducer that produces an output that is a symmetrical function. Symmetrical function as used in this specification means a function such that the second half of the function if it were folded back on the first half of the function would coincide with the first half of the function. In other words, for every point on the first half of the function there is a corresponding, equal amplitude, equal distance from the center of the function, point on the second half of the function.

Yet another object of this invention is to provide an ultrasonic transducer that produces an output such that any cross-section of the output through its center is a symmetrical function.

Other objects and advantages of this invention will become apparent hereinafter in the specification and drawings.

SUMMARY OF THE INVENTION

The invention is an ultrasonic transducer consisting essentially of a piezoelectric crystal with several concentric circular ring electrodes on one side of the piezoelectric crystal. An AC source and a resistor network is provided for applying different amplitudes of the AC source to each of the electrodes. The amplitudes of the signal supplied to the different electrodes if plotted from the outermost to the innermost of the electrodes is a plot that fits one-half of a Gaussian function. Consequently, the output of the ultrasonic transducer is a signal having a profile corresponding to the Gaussian function.

BRIEF DESCRIPTION OF THE DRAWINGS

FIGS. *1a* and *1b* are the near field and far field profiles of prior art ultrasonic transducers.

Figure 1:
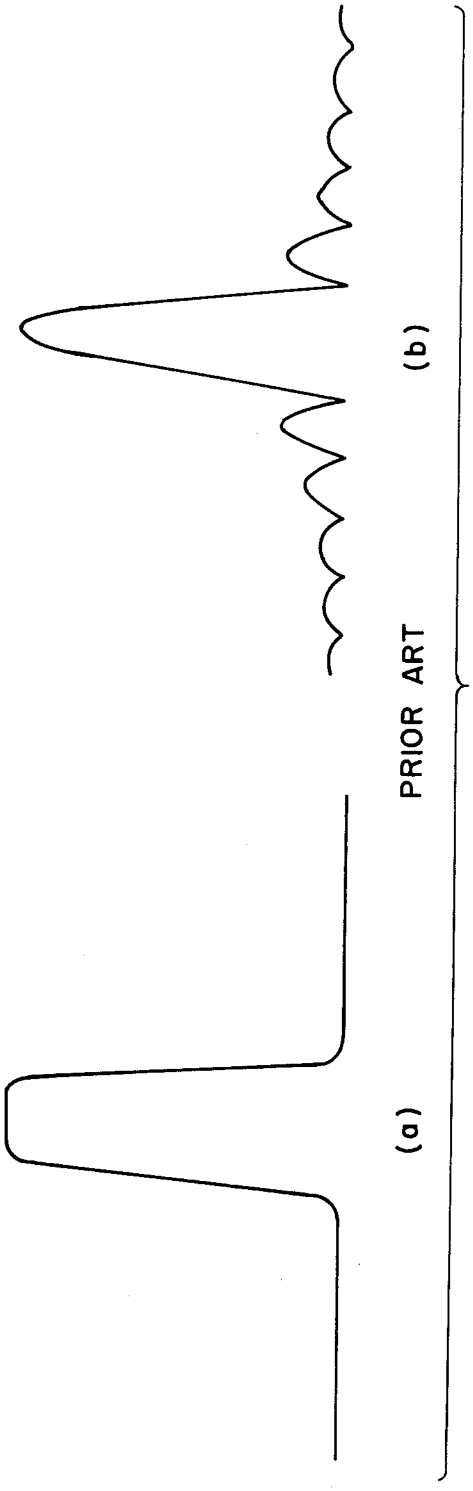
PRIOR ART FIG. 1

FIGS. *4a* and *4b* are profiles of the far field and near field output of the invention.

DETAILED DESCRIPTION OF THE INVENTION

Turning now to the embodiment of the invention selected for illustration in the drawings the number 11 designates a circular, 19.1 mm diameter, 2.25 MHz X-cut quartz crystal. Several concentric circular ring electrodes 12 are formed on one side of the crystal 11. The innermost electrode can be in the shape of a small disc instead of a ring as shown. The electrode pattern is photo etched into a layer of chrome and gold on the quartz crystal. A wear plate 13 is attached to crystal 11 on the side opposite the electrodes by means of a conductive adhesive.

Figure 2:
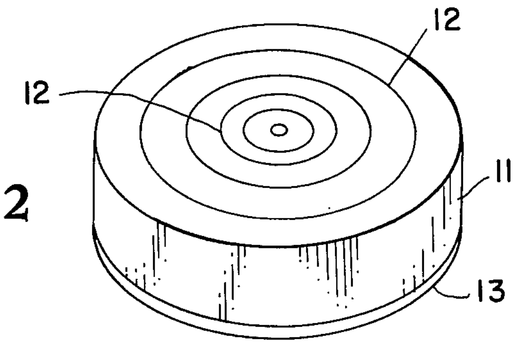
FIG. 2 is a schematic drawing of the ultrasonic transducer utilized in the invention.
Figure 3:
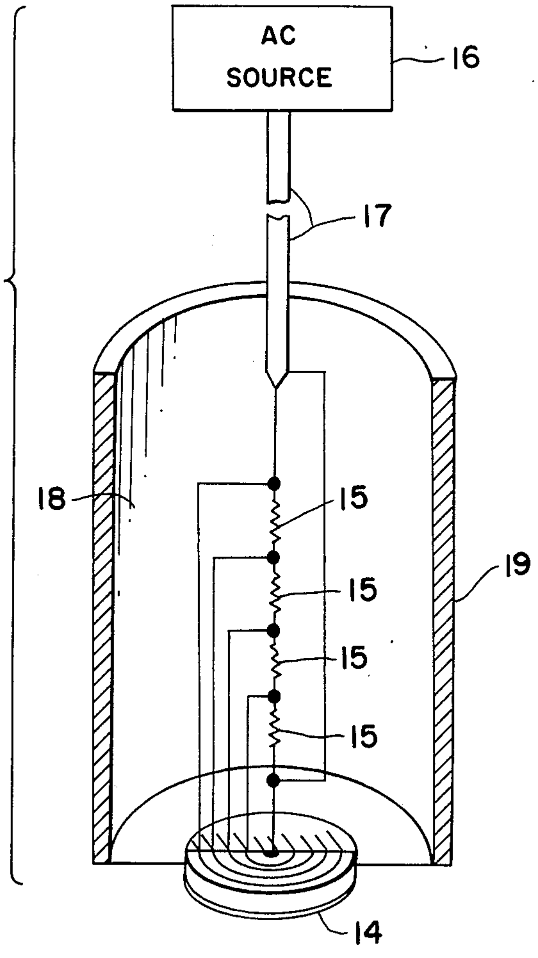
FIG. 3 is a schematic drawing of the complete embodiment of the invention.

As shown in FIG. 3 the transducer disclosed in FIG. 2 is designated as 14 and is connected to a network of resistors 15. A 2.25 MHz AC source 16 is connected to the resistor network by means of a coaxial cable 17. The junctions of the resistors 15 in the resistor network are connected to different ones of the electrodes 12 on transducer 14. Consequently, a different amplitude AC voltage is applied to each of the electrodes 12.

Since different voltage amplitudes are applied to the electrodes 12, an electric field distribution which is exclusively a function of radius will be produced by the set of concentric ring electrodes 12. If the circumference of the rings is large with respect to the spacing between successive electrodes, the electric field in the gaps may be considered to be a linear function of radius. Placing the proper voltages on electrodes 12 by means of the different sizes of the resistors 15 in the resistor network a piece-wise linear function which approximates a Gaussian function may be generated on the face of the piezoelectric crystal 11. The degree to which this function fits the desired Gaussian function is determined by the width of each electrode ring, the number of electrodes, and the distribution of the electrode radii on the radius of the transducer crystal. Since the desired Gaussian voltage function attains a particular value at only one mathematical point on the radius, the electrode width should be as small as possible. The photoetching techniques used in the FIG. 1 transducer construction, however, required a minimum electrode width of approximately 0.5 mm. The degree of fit to the desired Gaussian shape may be improved by using a large number of electrodes but this requires that the inner electrode spacing be small thereby increasing the possibility of electrical breakdown between adjacent angular rings when high voltages are applied. Considering these practical limitations in the present embodiment of the invention it was found that with as few as five electrodes, the mean absolute fit error may be reduced to less than 1.5% of the peak.

Capacitance between electrodes and the wear plate ground plane was calculated and empirically verified to be less than 2 picofarads, producing a negligible reactive impedance at the 2.25 MHz operating frequency. Since this impedance is low, the simple resistive network in FIG. 3 may be used to fix the desired set of electrode voltages.

The leads of the resistive network are attached to electrode 12 using a conductive adhesive and a dome of epoxy 18 is applied to the electrode side of transducer 14 to provide mechanical support for the leads and to attenuate and disperse resonant surface wave modes. Further damping is accomplished by a thin semi-viscous layer of electrically conductive adhesive placed on the opposite uncoated side of transducer 14 and under a thin aluminum foil wear plate 13. The entire transducer assembly is placed in a 1.3 cm diameter cylindrical PVC case 19 and potted in filler-loaded epoxy 18.

Figure 4:
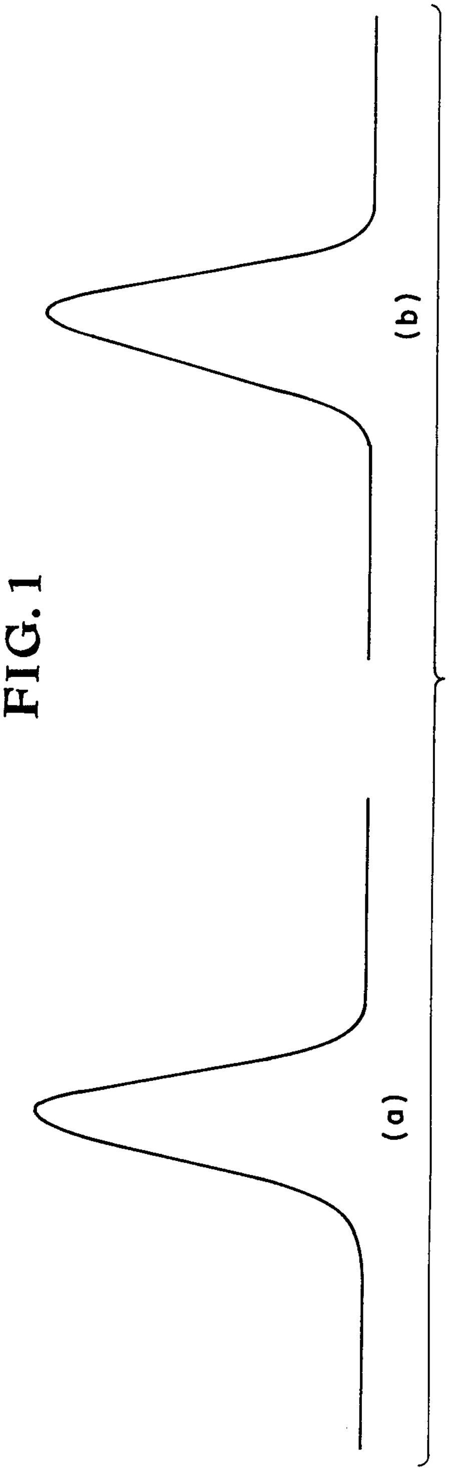

FIG. **4*a* shows the near field pressure distribution output of the transducer and FIG. 4*b*** shows the far field pressure distribution output of the transducer. As can be noted the two are practically the same.

A Gaussian function is generated by transducer 14 by applying different amplitude voltages to electrodes 12. If these different amplitude voltages were plotted from the outermost electrode to the innermost electrode the plot would be the first half of the Gaussian function. Hence, once the spacings between electrodes 12 are first fixed, it is only necessary to select the sizes of resistors 15 to apply the appropriate voltage amplitudes to the electrodes. The appropriate voltage amplitudes are the ones that will fit the first half of the Gaussian function.

Even though this invention is disclosed as generating a Gaussian function, it can be used to generate any symmetrical function. That is, electrodes 12 can be placed and resistors 15 can be selected such that any cross-section of the output through the center of the output can be any symmetrical function.

The advantages of this invention are that it provides a simple inexpensive transducer that produces an output having a Gaussian or other symmetrical function profile. In addition, the near field and far field outputs of the transducer are similar.

What is claimed is:

1. An ultrasonic transducer having a radial pressure distribution corresponding to a symmetrical function comprising:

means for supplying an AC voltage;

a piezoelectric crystal;

several concentric circular ring electrodes attached to one side of said piezoelectric crystal; and means for applying a different amplitude of said AC voltage to each of said electrodes;

wherein a plot of said different amplitudes applied to said electrodes from the outermost to the innermost is a plot that fits one-half of said symmetrical function;

whereby any cross-section through the center of the ultrasonic signal emitted from the side of said piezoelectric crystal opposite said one side has a pressure distribution corresponding to said symmetrical function.

2. An ultrasonic transducer according to claim 1 wherein said symmetrical function is a Gaussian function.

3. An ultrasonic transducer according to claim 2 wherein a wear plate is attached to said opposite side of said piezoelectric crystal.

4. An ultrasonic transducer according to claim 2 wherein said means for applying a different amplitude of said AC voltage to each of said electrodes is an impedance network.

5. An ultrasonic transducer according to claim 4 including a housing for supporting said piezoelectric crystal and for housing said impedance network.

6. An ultrasonic transducer according to claim 4 wherein said housing is filled with epoxy to provide support for the leads in the impedance network and to attenuate and disperse resonant surface wave modes.

7. An ultrasonic transducer according to claim 1 wherein the distance between any two adjacent said ring electrodes is greater than the widths of either electrode in the plane of said electrodes.

* * * * *